United States Patent

Naniwae

Patent Number: 6,072,202
Date of Patent: Jun. 6, 2000

[54] II-VI COMPOUND SEMICONDUCTOR DEVICE WITH III-V BUFFER LAYER

[75] Inventor: Koichi Naniwae, Tokyo, Japan

[73] Assignee: NEC Corporation, Japan

[21] Appl. No.: 08/936,272

[22] Filed: Sep. 24, 1997

[30] Foreign Application Priority Data

Sep. 26, 1996 [JP] Japan ................... 8-254622

[51] Int. Cl.$^7$ .................................. H01L 33/00
[52] U.S. Cl. .................... 257/190; 257/200; 257/13; 257/15; 257/97
[58] Field of Search ................... 257/190, 200, 257/201, 13, 15, 97

[56] References Cited

U.S. PATENT DOCUMENTS

| 5,481,558 | 1/1996 | Ikeda et al. | 372/45 |
| 5,488,233 | 1/1996 | Ishikawa et al. | 257/94 |
| 5,539,239 | 7/1996 | Kawazu et al. | 257/94 |

FOREIGN PATENT DOCUMENTS

| 62-88329 | 4/1987 | Japan | H01L 21/36 |
| 6104533 | 4/1994 | Japan | H01S 3/18 |
| 6-291032 | 10/1994 | Japan | H01L 21/20 |
| 6302859 | 10/1994 | Japan | H01L 33/00 |

OTHER PUBLICATIONS

Matthews et al, Defects in Epitaxial Multilayers, Journal of Crystal Growth 27, (1974) pp. 118–125.

Wu et al, Molecular Beam Epitaxy of Low Defect Density . . . , Appl. Phys. Lett. 68 (20), May 13, 1996, pp. 2828–2830.

Hua et al, Microstructure Study of a Degraded Pseudomorphic Separate Confinement Heterostructure Blue–Green Laser Diode, Appl. Phys. Lett. 65 (11), Sep. 12, 1994, pp. 1331–1333.

Primary Examiner—John Guay
Attorney, Agent, or Firm—Hayes, Soloway, Hennessey, Grossman & Hage, P.C.

[57] ABSTRACT

A layer structure for a II-VI compound semiconductor device is formed on a GaAs substrate of III-V compound, wherein lattice mismatching is prevented by a first layer interposed between the GaAs substrate and a II-VI compound semiconductor active layer and made of III-V compound semiconductor including In element as a constituent element thereof. The thickness of the first layer is less than the critical thickness allowing coherent growth. Alternatively, the III-V compound of the first layer has a lattice constant substantially equal to the lattice constant of the GaAs substrate. The first layer may be a superlattice layer.

18 Claims, 3 Drawing Sheets

- 13 II-VI COMPOUND
- 16 ZnSe BUFFER
- 14 GaAs BUFFER
- 11 GaAs SUBSTRATE

- 13 II-VI COMPOUND
- 12 III-V COMPOUND CONTAINING In
- 11 GaAs SUBSTRATE

II-VI COMPOUND SEMICONDUCTOR DEVICE WITH III-V BUFFER LAYER

BACKGROUND OF THE INVENTION (a) Field of the Invention

The present invention relates to a layer structure of a II-VI compound semiconductor device.

(b) Description of the Related Art

III-V compound semiconductors made from group III elements, such as Al, Ga and In, and group V elements such as As, P and Sb, are conventionally used for semiconductor lasers covering wavelengths from infrared ray to red color range and for light emitting diodes covering wavelengths from yellow to green color range. Wider range of bandgaps must be realized if a smaller wavelength of emission is desired which III-V compound semiconductors can hardly achieve.

On the other hand, II-VI compound semiconductors made from group II elements, such as Be, Zn, Cd and Mg, and group VI elements, such as S, Se and Te, exhibit comparatively large bandgaps and can emit light of almost all wavelengths within visible range to human eye. Recently, extensive R&D efforts have been made to achieve light emitting device materials covering particularly from green color to ultraviolet range.

Due to unavailability of high quality crystal structure of the II-VI compound in a bulk substrate, a bulk crystal wafer made from III-V compound materials in high quality is generally used as a substrate for the fabrication of the II-VI compound semiconductors. Among them, GaAs substrate having a lattice constant close to that of ZnSe, one of II-VI compound semiconductors, is most widely used for the fabrication of II-VI compound semiconductor light emitting devices, just because double heterostructure can be formed under the lattice matching condition by using mixed crystals such as ZnSSe and MgZnSSe.

In the II-VI compound laser diodes fabricated on the above GaAs substrate, however, due to the presence of crystal defects or misfit dislocations in II-VI compound semiconductors, the laser diodes are quickly deteriorated during operation thereof to retard a longer lifetime and a higher output power (See, for example, Appl. Phys. Lett. Vol.65, 1331 Page, 1994).

It is generally known that a crystal defect generated in the interface between a II-VI compound and a III-V compound (referred to as II-VI/III-V interface, hereinafter) easily grows to a three dimensional growth once Ga and Se, or Ga and S, are coupled to form the crystal defect. It is, therefore, important to control the II-VI/III-V interface for attaining a high quality crystal growth of II-VI compound thin layers.

FIG. 1 shows a conventional layer structure of II-VI compound semiconductor devices formed on a GaAs substrate 11 by MBE (Molecular Beam Epitaxy) technique. In order to grow the II-VI compound active layer on the GaAs substrate, first, a native oxide film formed on the GaAs substrate surface is removed by an As molecular beam in a growth chamber for growing III-V compound semiconductor (referred to as III-V compound growth chamber, hereinafter), which is interconnected with II-VI compound growth chamber by a vacuum conveyor. Subsequently, to reproduce the flatness of the substrate surface, a GaAs buffer layer 14 is grown, then the outermost surface of the GaAs buffer layer 14 is terminated with As atoms. After a GaAs buffer layer 14 is grown thereon, the resultant wafer is conveyed to the II-VI compound growth chamber. Thereafter, the substrate temperature is increased while the reconstruction pattern of As surface is observed using a reflection high-energy electron diffraction, to formulate the reconstruction pattern of 2×4 wherein the As coverage of around 75% is attained. The substrate temperature is then kept at 280° C., which is suited for growing a II-VI compound semiconductor thin film, while irradiating a group II molecule beam, to thereby start growth of a ZnSe buffer layer 16. During the step, the initial several atomic layers are grown under an excess group II condition to thereby suppress the coupling between Ga and Se, or Ga and S (See for example, Appl. Phys. Lett. Vol.68, Page2,828, 1996).

In the conventional method, it is difficult in practice to prevent the coupling beween Ga and Se, or Ga and S perfectly, whereby GaAs wafer surface is contaminated by S or Se remaining in the II-VI compound growth chamber (See for example, Appl. Phys. Lett. Vol.68, Page 2,828, 1996). Further, due to the variation in the As coverage within the wafer surface, there is a problem in uniformity and reproducibility of defect density within the wafer surface, which retards fabrication of a highly efficient II-VI semiconductor optical device with a longer lifetime.

SUMMARY OF THE INVENTION

It is, therefore, an object of the present invention to provide a highly uniform and high quality layer structure of a II-VI compound semiconductor device having a longer lifetime and a high output power.

The present invention provides, as an embodiment thereof, a II-VI compound semiconductor device comprising a GaAs substrate, at least one first layer made of III-V compound semiconductor formed on the GaAs substrate, the at least one first layer including an In-containing layer containing In as a constituent element thereof, the at least one first layer as a whole having a thickness lower than a critical thickness allowing coherent growth, and a second layer made of II-VI compound semiconductor formed on the at least one first layer.

In accordance with the present invention, high quality II-V compound semiconductor layer is obtained having a reduced defect density in the II-VI/III-V interface by the function of the III-V compound semiconductor layer containing In as a constituent element and formed between the GaAs buffer layer and the II-VI compound semiconductor layer.

The above and other objects, features and advantages of the present invention will be more apparent from the following description, referring to the accompanying drawings.

PREFERRED EMBODIMENTS OF THE INVENTION

Figure 1:
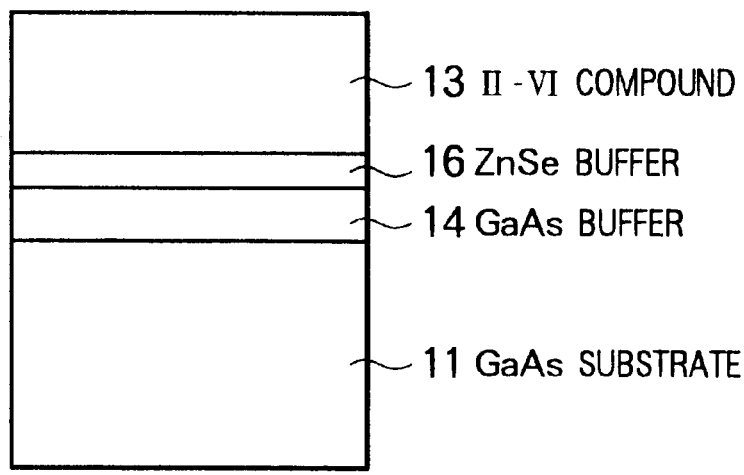
FIG. 1 is a cross-sectional view of a conventional layer structure of a II-VI compound semiconductor device.

Now, the present invention is more specifically described with reference to the accompanying drawings, wherein similar constituent elements are designated by the same or similar reference numerals throughout the drawings.

Figure 2:
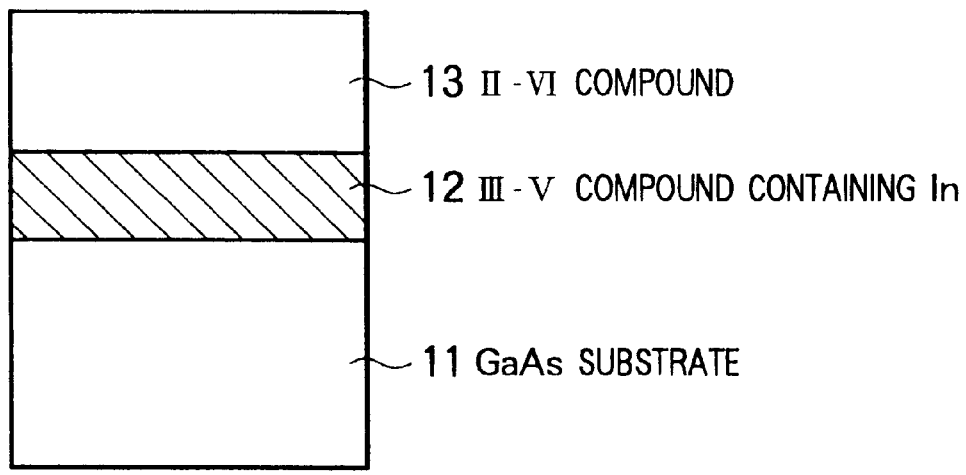
FIG. 2 is a cross-sectional view of a layer structure of a II-VI compound semiconductor device according to a first embodiment of the present invention.

Referring to FIG. 2, a II-VI compound semiconductor device according to a first embodiment of the present invention comprises a GaAs substrate (body) 11, and a III-V compound semiconductor film 12 containing In as a constituent element and a II-VI compound semiconductor layer 13, which are consecutively formed on the GaAs substrate 11.

In manufacture of the layer structure of the present embodiment, the III-V compound semiconductor film 12 containing In as a constituent element is first grown on the GaAs substrate 11 in a III-V compound growth chamber. The resultant wafer is then carried to a II-VI compound growth chamber by a vacuum conveyer for growth of the II-VI semiconductor layer 13.

In the layer structure of the present embodiment, the density of crystal defects can be reduced compared with the case wherein a II-VI compound semiconductor layer is directly grown on the GaAs substrate 11. Thus, a high quality layer structure of a II-VI compound semiconductor device can be obtained for use in an optical device or light emitting diode with less deterioration in the II-VI layers during operation thereof.

Figure 3:
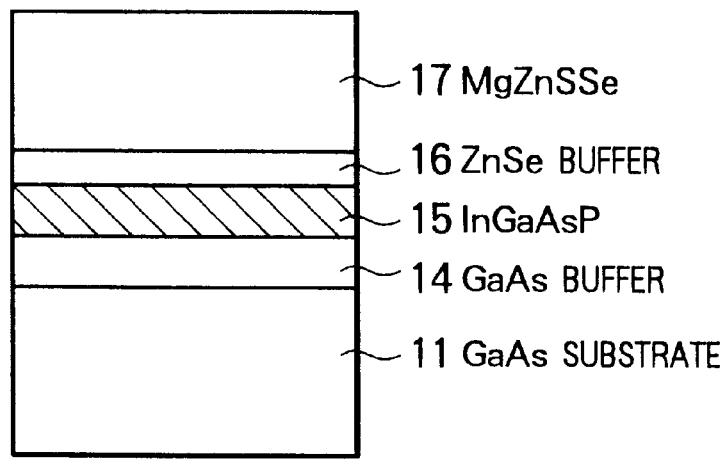
FIG. 3 is a cross-sectional view of a layer structure of a II-VI compound semiconductor device according to a second embodiment of the present invention.

Referring to FIG. 3, a more specific layer structure of the II-VI compound semiconductor device according to a second embodiment of the present invention comprises a GaAs substrate (body) 11, and a III-V compound semiconductor film 12 containing In as a constituent element and a II-VI compound semiconductor layer 13, which are consecutively formed on the GaAs substrate 11.

In the practical manufacture of the layer structure of the present embodiment, a native oxide film formed on the GaAs substrate surface was removed in the III-V compound growth chamber, followed by the growth of the GaAs buffer layer 14. Then, the InGaAsP layer 15 having an arbitrary composition was grown. The thickness of the InGaAsP layer 15 was set to less than the critical thickness below which crystal defects due to lattice mismatching is suppressed. According to the present embodiment, there was 0.1% lattice mismatching between the GaAs substrate 11 and the InGaAsP layer 15, the thickness of the InGaAsP layer 15 was set to around 0.1 $\mu$m in this example which was less than a critical thickness of 0.15 $\mu$m for the InGaAsP layer 15.

The critical thickness of the InGaAsP layer 15 varies depending on the rate of the lattice mismatching between the GaAs substrate and the InGaAsP layer 15 and can be calculated in accordance with "Kinetic Equation Theory" presented by Matthews and Blakeslee in J. Cryst. Growth, Vol.27, Page 118, 1974.

The resultant wafer was then conveyed to the II-VI compound growth chamber by the vacuum conveyer, for growth of about 10-nm-thick ZnSe buffer layer 16. Then about 1-$\mu$m-thick MgZnSSe layer 7 was grown.

The growth of ZnSe buffer layer 16 is effective to separate S from the II-VI/III-V interface because S has a stronger bond with Ga compared to the bond between Se and has a larger tendency of a three dimensional growth than Se.

Since the rate of lattice mismatching between ZnSe and GaAs is as low as 0.27%, ZnSe is effective as a buffer layer to be used on the side of the II-VI compound semiconductor when the II-VI compound semiconductor layer is grown on a GaAs substrate.

According to the second embodiment of the present invention, a layer structure of superior quality II-VI compound semiconductor device was obtained wherein the coupling between Ga and Se, or Ga and S, in the II-VI/III-V interface was suppressed, the density of crystal defects was reduced compared with the case of a direct growth on the GaAs buffer layer and the rate of a deterioration was smaller during operation thereof.

A layer structure according to a third embodiment of the present invention was obtained by specifying the structure of the second embodiment as shown in FIG. 3 such that the InGaAsP layer 15 in the second embodiment is specified as $In_{0.4}Ga_{0.6}As_{0.17}P_{0.83}$, which was grown to about 0.2 $\mu$m thickness, and of which lattice almost matches with the GaAs substrate 11. The growth of $In_{0.4}Ga_{0.6}As_{0.17}P_{0.83}$ is then followed by consecutive growth of a 10-nm-thick ZnSe buffer layer 16 and a 1-$\mu$m-thick MgZnSSe layer 17. The resultant film exhibited a superior quality.

Figure 4:
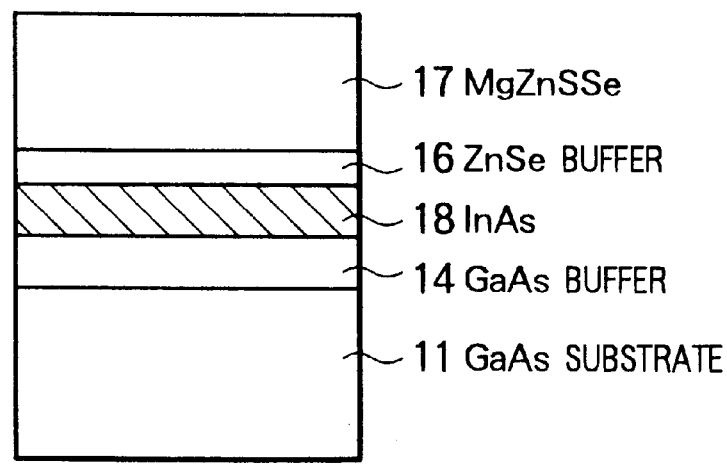
FIG. 4 is a cross-sectional view of a layer structure of a II-VI compound semiconductor device according to a third embodiment of the present invention.

By modifying the structure of the second embodiment such that the InGaAsP layer 15 is replaced by an InAs layer 18 as shown in FIG. 4, a layer structure of a II-VI compound semiconductor according to a fourth embodiment is obtained.

In the manufacture of the present embodiment, a native oxide film was removed in the III-V compound growth chamber, followed by growth of the GaAs buffer layer 14 and the InAs buffer layer 18. The resultant wafer is then carried by the vacuum conveyer to the II-VI compound growth chamber, for growing a ZnSe buffer layer 16 to a thickness of about 10 nm. Then, the MgZnSSe layer 17 is grown to a thickness of about 1 $\mu$m. According to the present embodiment, the thickness of the InAs layer 18 was determined around a critical thickness, which equals to about a monolayer thickness, for suppression of crystal defects which might be generated otherwise due to the presence of lattice mismatching of about 7% between the InAs layer 18 and the GaAs substrate 11.

According to the present embodiment, a high quality II-VI compound semiconductor layer was obtained because the II-VI/III-V interface contained only In of InAs as a group III element. Specifically, In does not react with Se or S, and suppress the growth of a three dimensional growth. Further, crystal defects were reduced compared with the direct growth of the ZnSe buffer layer 16 on the GaAs buffer layer 14, whereby deterioration in the II-VI layer during operation thereof was reduced when used as a light emitting device.

Figure 5:
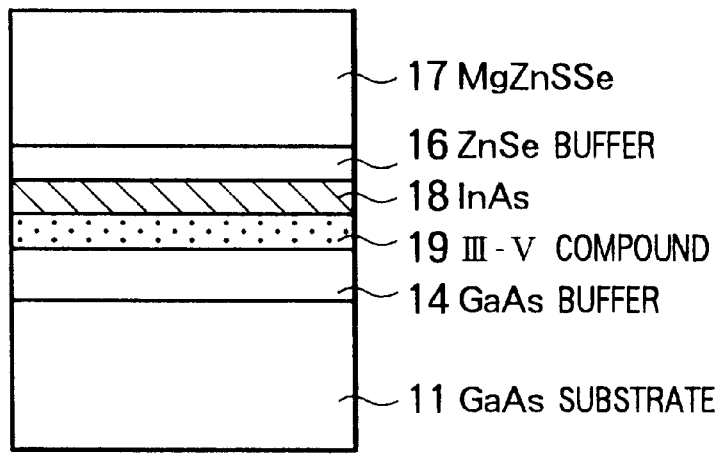
FIG. 5 is a cross-sectional view of a layer structure of a II-VI compound semiconductor device according to a fourth embodiment of the present invention; and, FIG. 6 is a cross-sectional view of a layer structure of a II-VI compound semiconductor device according to a fifth embodiment of the present invention.

By further modifying the structure of fourth embodiment such that a III-V compound 19 was inserted as a new layer between the GaAs buffer 14 and InAs layer 18 in the fourth embodiment as shown in FIG. 5, a layer structure of a II-VI compound semiconductor according to a fifth embodiment is obtained. The thickness of the semiconductor layer 19 is on the order of a monolayer. The thickness of the layer 19 as well as the InAs layer 18 should have a thickness less than the critical thickness.

Similar to the fourth embodiment, a 3/2-monolayer of GaP, a 1/2-monolayer of InP were consecutively grown after GaAs buffer layer 14 was grown on the GaAs substrate 11. Susequently, a 1/2-monolayer of InAs is grown on the InP layer. The rate of lattice mismatching between GaAs and those layers were—3.58% for GaP layer, 3.81% for InP layer, 7.17% for InAs layer, respectively, the average of which was about 0.048%. The average lattice mismatching was considerably small irrespective of whether the outermost surface is InAs. Thereafter, the resultant wafer was carried to II-VI growth chamber by the vacuum conveyer, wherein about 10-nm-thick ZnSe buffer layer 16 was grown, followed by the growth of the 1-$\mu$m-thick MgZnSSe layer 17.

A superior quality II-VI compound semiconductor was obtained because the II-VI/III-V interface contains only In of InAs among group III elements, which scarcely reacts with Se or S and suppresses a three dimensional growth. Moreover, since the average lattice constant of InAs/InP/GaP was close to GaAs, new crystal defects were not occurred in the superlattice layers, which fact suppressed deterioration during operation of the same when used as a light emitting device.

Figure 6:
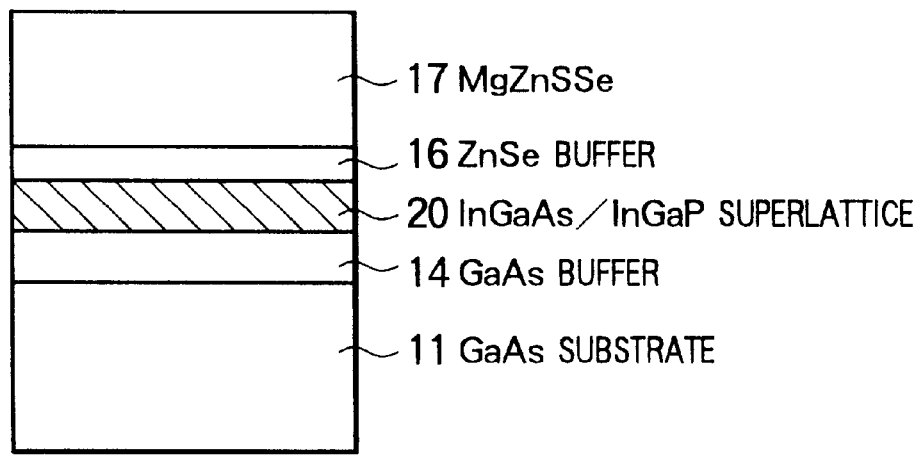

Referring to FIG. 6, a layer structure of a II-VI compound semiconductor device according to a sixth embodiment of the present invention comprises a GaAs buffer layer 14, an InGaAs/InGaP superlattice layer 20, a ZnSe buffer layer 16 and a MgZnSSe layer 17 as a II-VI compound semiconductor layer, which are consecutively formed on the GaAs substrate 11.

In manufacture of the present embodiment, a native oxide film formed on the GaAs substrate 11 was removed in the III-V compound growth chamber, followed by growth of the GaAs buffer layer 14. The superlattice layer 20 was then formed by growing alternately an InGaAs layer and an InGaP layer each having an arbitrary composition. Then, the resultant wafer was carried to the II-VI growth chamber by the vacuum conveyer. After the growth of an about 10-nm-thick ZnSe buffer layer 16, a MgZnSSe layer 17 having a thickness of 1 $\mu$m was grown.

A superior quality II-VI compound semiconductor was obtained by the present embodiment wherein the coupling between Ga and Se, or Ga and S, was suppressed. A smaller density of crystal defects was obtained, and the resultant semiconductor device exhibited less deterioration during operation thereof compared to the case of direct growth on the GaAs buffer layer 14.

The superlattice layer 20 as provided in the present embodiment reduces the average strain of the III-V compound semiconductor layer in the case of a larger content of In in the interface. It is, therefore, possible to suppress the crystal defects while maintaining the excellent lattice matching with the GaAs substrate 11.

It is preferable that the thickness of the superlattice layer be less than a critical thickness for the purpose of suppression of new occurrence of crystal defects. It is also preferable that the superlattice layer be totally lattice matched with the GaAs substrate 11. In this case, there will be no adverse effect on the critical thickness of the II-VI compound semiconductor layer formed thereabove.

A layer structure of a II-VI semiconductor device according to a seventh embodiment of the present invention was manufactured, wherein the total thickness of the superlattice layer 20 shown in FIG. 6 had a thickness below the critical thickness to thereby suppress the crystal defects which would otherwise be generated due to lattice mismatching between the InGaAs/InGaP superlattice layer 20 and the GaAs substrate 11. In the present embodiment, the superlattice layer included 10 cyclic combinations of a 3-nm-thick $In_{0.4}Ga_{0.6}As$ layer and a 11.5-nm-thick $In_{0.4}Ga_{0.6}P$ layer. In the resultant example, about a 2.87% lattice mismatching between the $In_{0.4}Ga_{0.6}As$ layer and the GaAs layer, and a −0.62% lattice mismatching between the $In_{0.4}Ga_{0.6}P$ layer and the GaAs layer were observed which resulted in an average of about 0.1% lattice mismatching between the superlattice layer and the GaAs layer. The total thickness of the superlattice layer including 10 combinations was determined at 0.145 $\mu$m which was less than the critical thickness of 0.15 $\mu$m.

The critical thickness of the superlattice layer depends on the rate of lattice mismatching between the GaAs substrate and the superlattice layer, which can be calculated in accordance with "Kinetic Equation Theory" presented in J. Cryst. Growth Vol.27, Page 118, 1974. On the superlattice layer, a 10-nm-thick ZnSe buffer layer 16 and a 1-$\mu$m-thick MgZnSSe layer 7 were then grown.

A superior quality II-VI compound semiconductor layer was obtained according to the present embodiment wherein the coupling between Ga and Se, or Ga and S, was suppressed. Further, new occurrence of crystal defects in the InGaAs/InGaP superlattice layers was also suppressed, thereby achieving a smaller density of crystal defects and less deterioration in a resultant light emitting device.

A layer structure of a II-VI semiconductor device according to an eighth embodiment was obtained by modifying the sixth embodiment such that InGaAs/InGaP superlattice layer 20 in the sixth embodiment was replaced by 20 cyclic combinations of a 5-nm-thick $In_{0.24}Ga_{0.76}As$ layer and a 5-nm-thick $In_{0.24}Ga_{0.76}P$ layer, which exhibited a crystal constant similar to the lattice constant of the GaAs substrate 11. On the superlattice layer, about a 10-nm-thick ZnSe buffer layer 16 was grown, followed by growth of about a 1-$\mu$m-thick MgZnSSe layer 17.

A superior quality II-VI compound semiconductor layer was obtained according to the present embodiment, wherein the coupling between Ga and Se, or Ga and S, was suppressed, occurrence of the new crystal defects was not observed in the superlattice lattice layer because the average lattice constant of the InGaAs/InGaP superlattice layer 20 is comparable with the lattice constant of the GaAs. Similar characteristics were also obtained in the present embodiment.

In the embodiments of the present invention as described above, only the growth of a MgZnSSe layer onto the GaAs substrate was exemplarily described. However, the present invention is also applicable to other layer structures of II-VI compound semiconductors such as ZnSSe, ZnCdSSe or BeMgZnSe, to obtain similar results irrespective of the conductivity types of the semiconductor and kinds of the dopant.

Al as a group III element or Sb as a group V element can be used as a part of the mixed crystal in the III-V compound semiconductor containing In so long as a suitable In combination is selected.

In the above embodiments, In is less coupled, compared to Ga, with Se or S remaining in the growth chamber prior to the growth step for the II-VI compound semiconductor, thereby preventing the formation of Ga—Se bonds or Ga—S bonds. Accordingly, contamination of the surface of III-V compound semiconductor by S or Se can be prevented. Thus, the density of defects propagated from the II-VI/III-V interface is reduced, and a high quality II-VI compound semiconductor layer can be grown on the GaAs substrate, which provides a long lifetime, high output power II-VI compound semiconductor device for use in light emitting diodes or semiconductor lasers.

A larger content of In in the III-V compound semiconductor as a constituent element provides a higher efficiency in suppression of crystal defects caused by the coupling of Se or S with Ga in the interface. Particularly, the superlattice layer, if provided, suppresses the increase of the average strain of the III-V compound semiconductor in the case of a higher content of In element in the interface, thereby effectively suppressing the defects while keeping the lattice matching with the GaAs substrate. The III-V compound semiconductor provided for compensating lattice mismatching provides the situation wherein only In among group III elements is present between II-VI/II-V interface to suppress the defects caused by three dimensional growth, because In can hardly couple with Se or S.

Since the function of the In for suppressing the occurrence of the defects depends on the content of the In on the surface, the function is not affected by the thickness of the III-V compound semiconductor layer. However, it is preferred that the thickness of the total III-V compound semiconductor layer should be less than the critical thickness for suppressing the new occurrence of crystal defects, in consideration of the film quality formed thereon. Moreover, it is most preferred that the average lattice constant of the III-V compound semiconductor layer be substantially identical to the lattice constant of the GaAs substrate.

It is also effective that the III-V compound semiconductor containing In is grown on a GaAs buffer layer formed on a GaAs substrate body to improve the flatness of the III-V compound semiconductor layer.

Since the above embodiments are described only for examples, the present invention is not limited to the above embodiments and various modifications or alterations can be easily made therefrom by those skilled in the art without departing from the scope of the present invention.

What is claimed is:

1. A II-VI compound semiconductor device comprising a GaAs substrate, at least one first layer made of III-V compound semiconductor formed on said GaAs substrate, said at least one first layer including an In-containing layer containing In as a constituent element thereof, said at least one first layer as a whole having a thickness lower than a critical thickness allowing coherent growth and a second layer made of II-VI compound semiconductor formed on said at least one first layer, wherein said at least one first layer forms a superlattice layer, wherein said superlattice layer has an average lattice constant which is substantially equal to a lattice constant of said GaAs substrate.

2. A II-VI compound semiconductor device as defined in claim 1, wherein said GaAs substrate is of n-conductivity type.

3. A II-VI compound semiconductor device as defined in claim 1, wherein said In-containing layer contains InGaAsP or InAs.

4. A II-VI compound semiconductor device as defined in claim 1, wherein said superlattice layer includes a plurality of cyclic combinations of an InGaAs layer and an InGaP layer.

5. A II-VI compound semiconductor device as defined in claim 1, wherein said GaAs substrate comprises a GaAs substrate body and a GaAs buffer layer.

6. A II-VI compound semiconductor device comprising a GaAs substrate, at least one first layer made of III-V compound semiconductor formed on said GaAs substrate, said at least one first layer including an In-containing III-V compound mixed crystal layer containing In as a constituent element thereof, said ast one first layer as a whole having a thickness lower than a critical thickness allowing coherent growth and a second layer made of II-VI compound semiconductor formed on said at least one first layer, wherein said GaAs substrate is of n-conductivity type, and comprises a GaAs substrate body and GaAs buffer layer.

7. A II-VI compound semiconductor device comprising a GaAs substrate, at least one first layer made of III-V compound semiconductor formed on said GaAs substrate, said at least one first layer including an In-containing layer containing In as a constituent element thereof, said at least one first layer having a composition allowing substantial lattice matching between said GaAs substrate and said at least one first layer, and a second layer made of II-VI compound semiconductor formed on said at least one first layer, wherein said at least one first layer forms a superlattice layer which superlattice layer includes a plurality of cyclic combinations of an InGaAs layer and a InGaP layer.

8. A II-VI compound semiconductor device as defined in claim 7, wherein said superlattice layer has an average lattice constant which is substantially equal to a lattice constant of said GaAs substrate.

9. A II-VI compound semiconductor device comprising a GaAs substrate, at least one first layer made of III-V compound semiconductor formed on said GaAs substrate, said at least one first layer including an InGaAs or InAs layer containing In as a constituent element thereof, said at least one first layer as a whole having a thickness lower than a critical thickness allowing coherent growth and a second layer made of II-VI compound semiconductor formed on said at least one first layer.

10. A II-VI compound semiconductor device as defined in claim 9, wherein said GaAs substrate is of n-conductivity type.

11. A II-VI compound semiconductor device as defined in claim 9, wherein said at least one first layer forms a superlattice layer.

12. A II-VI compound semiconductor device as defined in claim 9, wherein said at least one first layer includes a plurality of cyclic combinations of an InGaAs layer and an InAs layer.

13. A II-VI compound semiconductor device as defined in claim 9, Wherein said at least one first layer has an average lattice constant which is substantially equal to a lattice constant of said GaAs substrate.

14. A II-VI compound semiconductor device as defined in claim 9, wherein said GaAs substrate comprises a GaAs substrate body and a GaAs buffer layer.

15. A II-VI compound semiconductor device comprising a GaAs substrate, at least one first layer made of III-V compound semiconductor formed on said GaAs substrate, said at least one first layer including an In-containing layer containing InGaAsP or InAs as a constituent element thereof, said at least one first layer as a whole having a thickness lower than a critical thickness allowing coherent growth and a second layer made of II-VI compound semiconductor formed on said at least one first layer, wherein said GaAs substrate comprises a GaAs substrate body and GaAs buffer layer.

16. A II-VI compound semiconductor device comprising a GaAs substrate, at least one first layer made of III-V compound semiconductor formed on said GaAs substrate, said at least one first layer including an In-containing layer containing In as a constituent element thereof, said at least one first layer forms a superlattice layer, said at least one first layer as a whole having a thickness lower than a critical thickness allowing coherent growth and a second layer made of II-VI compound semiconductor formed on said at least one first layer, wherein said GaAs substrate comprises a GaAs substrate body and GaAs buffer layer.

17. A II-VI compound semiconductor device comprising a GaAs substrate, at least one first layer made of III-V compound semiconductor formed on said GaAs substrate, said at least one first layer including an In-containing III-V compound mixed crystal layer containing InGaAsP or InAs, said at least one first layer as a whole having a thickness lower than a critical thickness allowing coherent growth and a second layer made of II-VI compound semiconductor formed on said at least one first layer, wherein said GaAs substrate comprises a GaAs substrate body and GaAs buffer layer.

18. A II-VI compound semiconductor device comprising a GaAs substrate, at least one first layer made of III-V compound semiconductor formed on said GaAs substrate, said at least one first layer including an In-containing III-V compound mixed crystal layer containing In as a constituent element thereof, said at least one first layer forming a superlattice layer, said at least one first layer as a whole having a thickness lower than a critical thickness allowing coherent growth and a second layer made of II-VI compound semiconductor formed on said at least one first layer, wherein said GaAs substrate comprises a GaAs substrate body and GaAs buffer layer.

* * * * *

UNITED STATES PATENT AND TRADEMARK OFFICE
CERTIFICATE OF CORRECTION

PATENT NO. : 6,072,202
DATED : June 6, 2000
INVENTOR(S) : Koichi Naniwae

It is certified that error appears in the above-identified patent and that said Letters Patent is hereby corrected as shown below:

Column 7, claim 6,
Line 60, "ast" should be -- at least --

Column 8, claim 13,
Line 35, "Wherein" should be -- wherein --

Signed and Sealed this

Nineteenth Day of March, 2002

Attest:

Attesting Officer

JAMES E. ROGAN
Director of the United States Patent and Trademark Office